United States Patent
Hsieh et al.

(10) Patent No.: US 6,995,979 B2
(45) Date of Patent: Feb. 7, 2006

(54) HEAT-DISSIPATING FAN MODULE OF ELECTRONIC APPARATUS

(75) Inventors: Hung-Chang Hsieh, Taoyuan Hsien (TW); Chih-Chi Wu, Taoyuan Hsien (TW); Jui-Yuan Hsu, Taoyuan Hsien (TW); Chih-Jen Chen, Taoyuan Hsien (TW); Min-Wen Kao, Taoyuan Hsien (TW); Jen-Chieh Peng, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 10/691,641

(22) Filed: Oct. 24, 2003

(65) Prior Publication Data

US 2004/0218360 A1    Nov. 4, 2004

(30) Foreign Application Priority Data

May 2, 2003    (TW) .............................. 92112192 A (51) Int. Cl.
H05K 7/20    (2006.01)
F01D 25/26    (2006.01)
F01D 1/02    (2006.01)

(52) U.S. Cl. ................. 361/695; 415/213.1; 415/208.1

(58) Field of Classification Search ........ 361/690–695; 257/721; 174/16.1, 16.3; 165/80.3, 104.33, 165/122; 454/184; 415/213.1, 208.1
See application file for complete search history.

(56) References Cited

U.S. PATENT DOCUMENTS

| | | | | |
|---|---|---|---|---|
| 4,517,880 A | * | 5/1985 | Buckner et al. | 454/184 |
| 5,586,865 A | * | 12/1996 | Yin | 415/213.1 |
| 5,707,282 A | * | 1/1998 | Clements et al. | 454/184 |
| 5,969,942 A | * | 10/1999 | Heckner et al. | 361/695 |
| 6,074,296 A | * | 6/2000 | Wu | 454/184 |
| 6,115,250 A | * | 9/2000 | Schmitt | 361/695 |
| 6,135,875 A | * | 10/2000 | French | 454/184 |
| 6,343,011 B1 | * | 1/2002 | Yu | 361/695 |
| 6,485,260 B2 | * | 11/2002 | Orlowski et al. | 415/213.1 |
| 6,503,055 B1 | * | 1/2003 | Gerenski et al. | 415/208.1 |
| 6,524,067 B1 | * | 2/2003 | Chen et al. | 415/208.5 |
| 6,554,698 B2 | * | 4/2003 | Kranzdorf et al. | 454/184 |
| 6,817,939 B2 | * | 11/2004 | Gan et al. | 454/184 |

* cited by examiner

Primary Examiner—Boris Chervinsky
(74) Attorney, Agent, or Firm—Bacon & Thomas, PLLC (57) ABSTRACT

A heat-dissipating fan module of an electronic apparatus is disclosed. The heat-dissipating fan module includes a casing having an opening, the opening having a guiding device along an edge thereof, and a heat-dissipating fan fixed to one side of the casing and correspondingly disposed on the opening.

8 Claims, 8 Drawing Sheets

HEAT-DISSIPATING FAN MODULE OF ELECTRONIC APPARATUS

FIELD OF THE INVENTION

The present invention relates to a heat-dissipating fan module, and more particularly to a heat-dissipating fan module of an electronic apparatus.

BACKGROUND OF THE INVENTION

Power supply is an essential device for various electronic equipments or information products. As we well know, many electronic units included in the power supply generate heat when the power supply is operating. The heat generation results in the increase of internal temperature of the power supply. Generally, there is one or plural heat-dissipating fans disposed on the power supply for quickly dissipating the internal hot air out of the casing or introducing the external cooling air to the casing for cooling the power supply down. Hence, the temperature inside the casing is decreased for preventing the electronic units from being damaged and decreasing the life span due to high temperature. In addition, the heat-dissipation of the core electronic element, for example CPU, of the electronic equipment or information product can be achieved by the design of the heat-dissipating fan and the position of the heat-dissipating hole. Thus, the temperature of the whole system can be decreased.

Figure 1A:
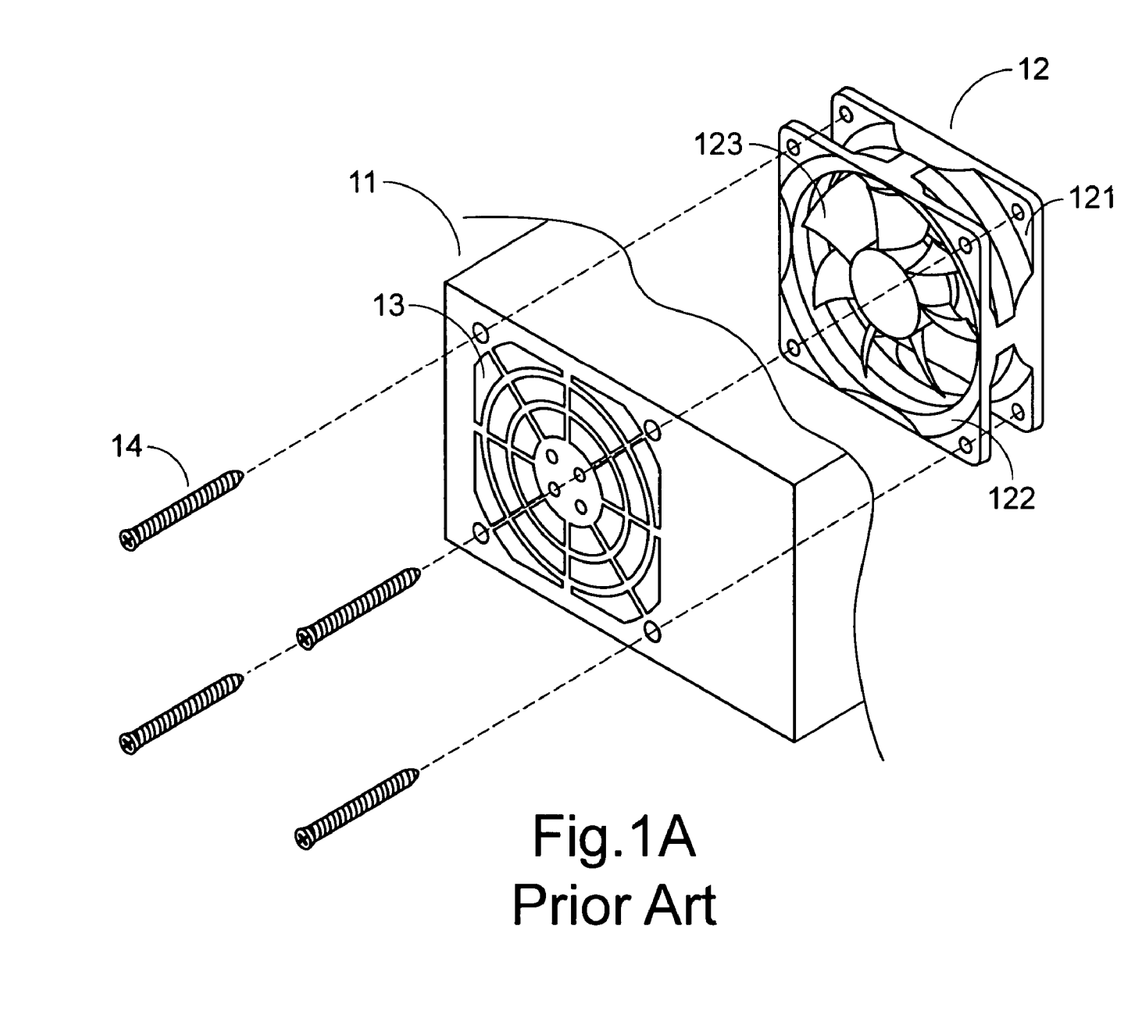
FIG. 1A is a schematic diagram illustrating a conventional heat-dissipating fan module of a power supply.

Please refer to FIG. 1A which is a schematic diagram illustrating a conventional heat-dissipating fan module of a power supply. As shown in FIG. 1A, the heat-dissipating fan module includes a casing 11 having a reticular portion 13 and a heat-dissipating fan 12. The reticular portion 13 is formed by means of punching the casing 11 to remove partial metal material of the casing 11.

As sown in FIG. 1A, the heat-dissipating fan 12 is fixed into one side of the casing 11 by screws 14 and correspondingly disposed on the reticular portion 13 of the casing 11. The heat-dissipating fan 12 further includes a frame 121, a guiding device 122 and a plurality of blades 123. The guiding device 122 is disposed between the frame 121 and the plural blades 123 for guiding the airflow and increasing the air flow rate of the heat-dissipating fan 12 to enhance the heat-dissipating effect. When the heat-dissipating fan 12 is operating, the heat accumulated in the power supply is dissipated out of the casing 11 by drawing the hot air out of the reticular portion 13 or the heat-dissipating holes (not shown in FIG. 1A) or introducing the external cooling air to cool down the power supply and dissipating the hot air via the heat-dissipating holes.

Since the reticular portion 13 of the casing 11 in the conventional heat-dissipating fan module is formed by means of punching the casing 11 to remove partial metal material of the casing 11, the removed metal material portion cannot be reused, resulting in the material consumption. In addition, the design of the frame 121 and guiding device 122 of the conventional heat-dissipating fan is complex and increase the cost.

Figure 1B:
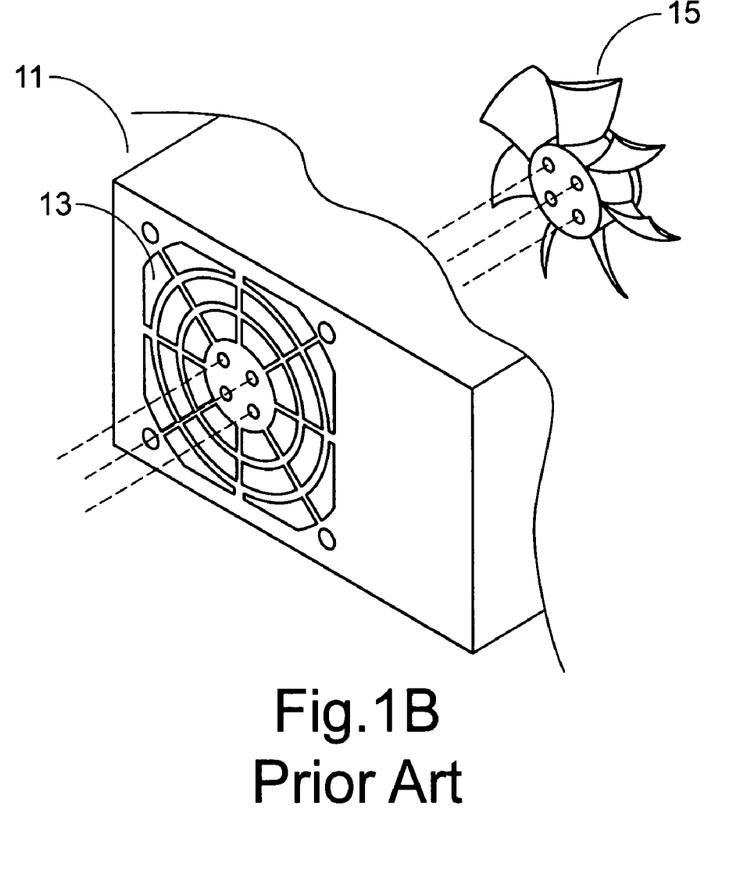
FIG. 1B is a schematic diagram illustrating another conventional heat-dissipating fan module of a power supply.

Moreover, the operation of the heat-dissipating fan 12 causes a loud noise because of the frame 121. There is another conventional heat-dissipating fan module of the power supply shown in FIG. 1B for solving the noise problem. As shown in FIG. 1B, a heat-dissipating fan 15 without the frame and the guiding device is used to replace the heat-dissipating fan 12 of FIG. 1A. However, the heat-dissipating effect for this design cannot be enhanced.

Therefore, the purpose of the present invention is to develop a heat-dissipating fan module of an electronic apparatus to deal with the above situations encountered in the prior art.

SUMMARY OF THE INVENTION

An object of the present invention is to provide a heat-dissipating fan module of an electronic apparatus for decreasing the material consumption, reducing the noise and enhancing the heat-dissipating effect of the whole electronic apparatus.

According to an aspect of the present invention, there is provided a heat-dissipating fan module of an electronic apparatus. The heat-dissipating fan module includes a casing having an opening, the opening having a guiding device along an edge thereof, and a heat-dissipating fan fixed to one side of the casing and correspondingly disposed on the opening.

Preferably, the guiding device is a metal material disposed on the edge portion of the opening. More preferably, the guiding device is extended from the edge of the opening and inclined toward the axis of the opening.

Preferably, the casing and the guiding device are disposed to form a particular angle. More preferably, the particular angle is substantially 5 to 90 degrees.

In an embodiment, the heat-dissipating fan is a fan without a frame.

In an embodiment, the casing further includes a reticular portion integrally formed therewith and disposed at the corresponding position of the opening.

In an embodiment, the heat-dissipating fan module of an electronic apparatus further includes a reticular plate, wherein the reticular plate is separably fixed to one side of the casing for covering the opening.

For example, the electronic apparatus can be a power supply.

According to another aspect of the present invention, there is provided a heat-dissipating fan module of an electronic apparatus. The heat-dissipating fan module includes a casing having an opening, a guiding device separably disposed around an edge of the opening, and a heat-dissipating fan disposed on one side of the casing and correspondingly disposed on the opening.

Preferably, the casing further comprises a reticular portion integrally formed therewith and disposed at the corresponding position of the opening.

Preferably, the heat-dissipating fan module of the electronic apparatus further includes a reticular plate, wherein the reticular plate is separably fixed to one side of the casing for covering the opening. For example, the reticular plate can be made of metal material, paper material or plastic material. In an embodiment, the guiding device is separated from the reticular plate. In another embodiment, the guiding device is integrally formed with the reticular plate.

The present invention may best be understood through the following description with reference to the accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 2A:
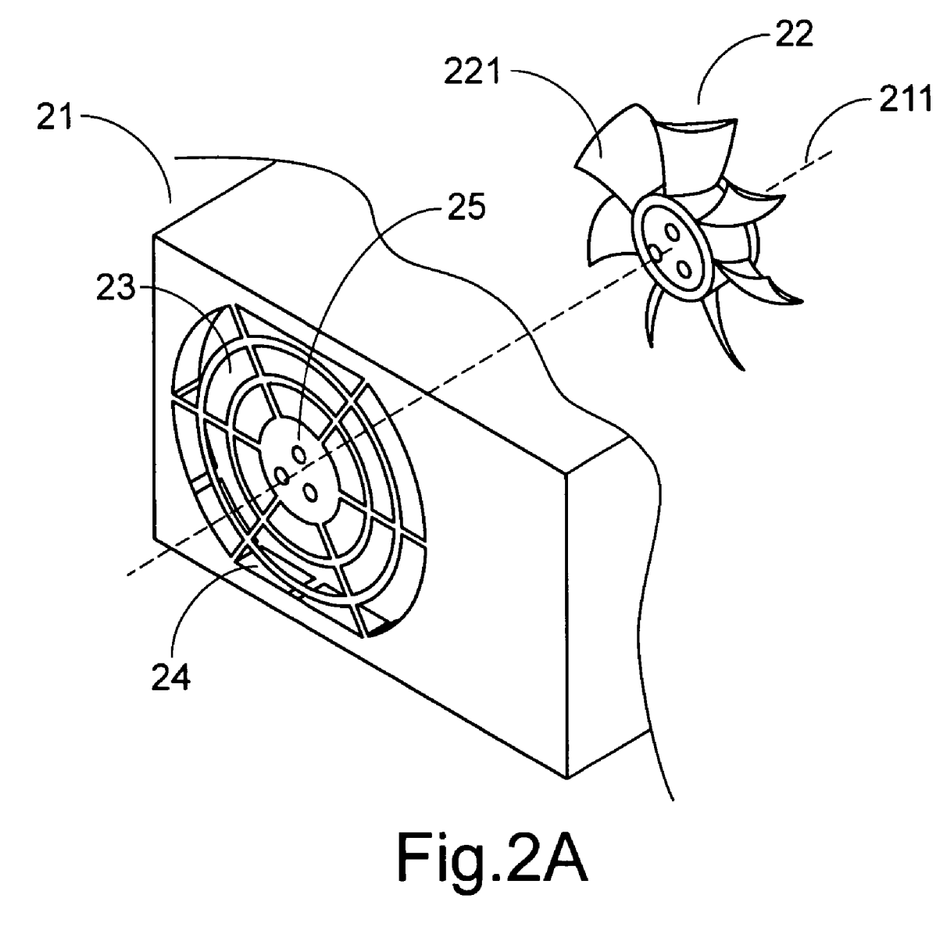
FIG. 2A is a schematic diagram illustrating a preferred embodiment of a heat-dissipating fan module of a power supply according to the present invention, wherein a guiding device and a reticular portion are integrally formed with a casing.

Please refer to FIG. 2A which is a schematic diagram illustrating a preferred embodiment of a heat-dissipating fan module of a power supply according to the present invention, wherein a guiding device and a reticular portion are integrally formed with a casing. As shown in FIG. 2A, the heat-dissipating fan module of the power supply includes a casing 21 and a heat-dissipating fan 22. The casing 21 includes an opening 23 and a guiding device 24, which is extended along the edge of the opening 23. The heat-dissipating fan 22 is fixed to one side of the casing 21 and corresponded to the opening 23. The guiding device 24 guides the airflow to enhance the heat-dissipating effect when the heat-dissipating fan is operating.

In this embodiment, the casing 21 further includes a reticular portion 25, which is integrally formed with the casing 21 and disposed in the opening 23. The reticular portion 25 is used for fixing the heat-dissipating fan 22 thereto and preventing the user from touching the heat-dissipating fan 22 to cause danger when the heat-dissipating fan 22 is operating. The opening 23 and the reticular portion 25 are formed by means of punching the casing 21 to remove partial metal material of the casing 21. The guiding device 24 is made of a metal material disposed on the edge of the opening 23 and extended from the edge of the opening 23 at a particular angle or inclined toward an axis direction. The axis parallels an axis 211 of the opening 23 as shown in FIG. 2A. The particular angle between the guiding device 24 and the casing 21 is dependent on the heat-dissipating requirement and ranges preferably from 5 to 90 degrees.

In addition, the heat-dissipating fan 22 in FIG. 2A having a plurality of blades 221 is a fan without a frame. Besides by screwing in this embodiment, the heat-dissipating fan 22 can be fixed to one side of the casing 21 by engaging or adhering. The heat-dissipating fan 22 is disposed on the central portion of the reticular portion 23 corresponding into the opening 23. Accordingly, when the heat-dissipating fan 22 is operating, the guiding device 24 leads and increases airflow to enhance the heat-dissipating effect for quickly dissipating the heat generated by the electronic devices inside the casing 21.

For cost down reason, the guiding device 24 is made of the metal material disposed at the edge portion of the opening 23. The metal material of this edge portion is originally designed to remove but kept to form the guiding device 24 by bending the metal material along the axis 211 at the particular angle as shown in FIG. 2A. Hence, the original removed metal material becomes the guiding device 24, resulting in the decrease of cost. In addition, the heat-dissipating fan 22 without the frame can efficiently reduce not only the noise generated from the operation of fan but also the cost.

Figure 2B:
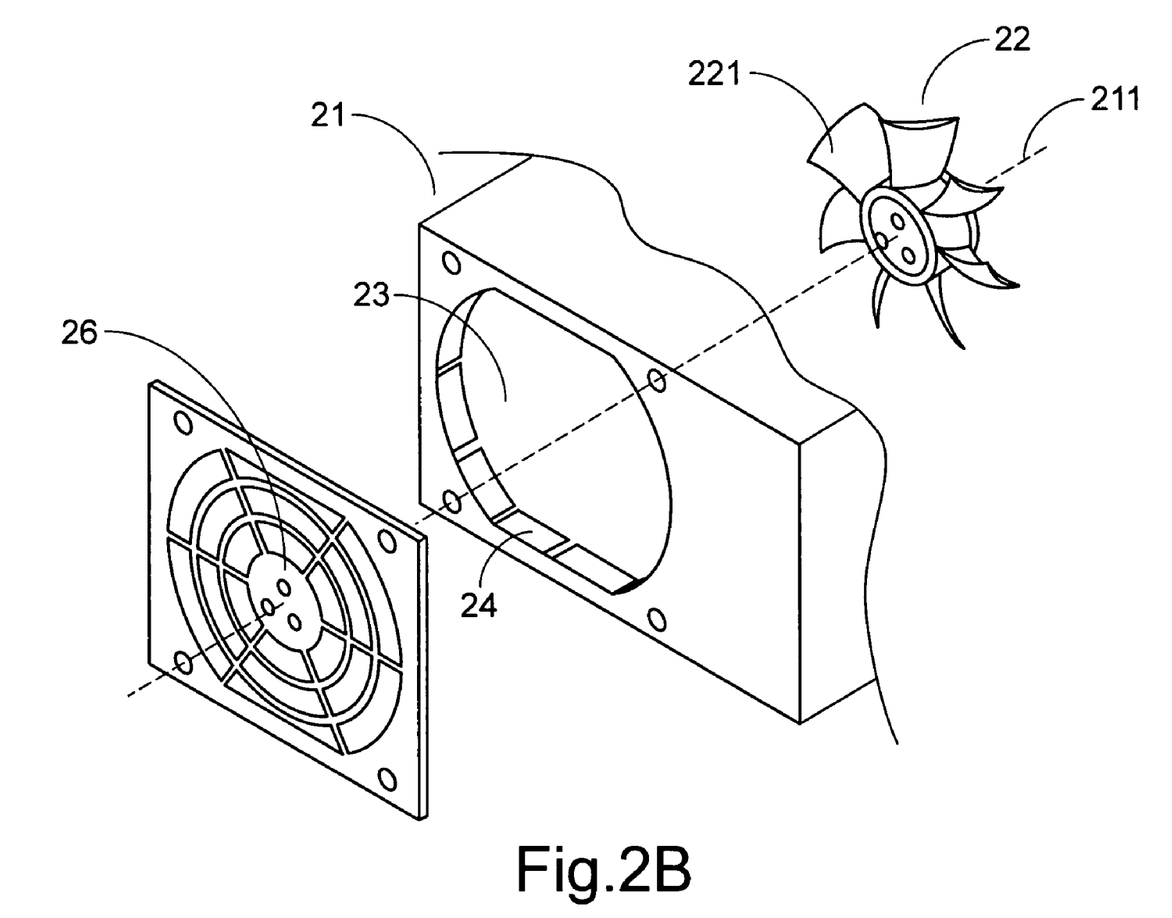
FIG. 2B is a schematic diagram illustrating another preferred embodiment of a heat-dissipating fan module of a power supply according to the present invention, wherein a reticular portion is separated from a casing.

Please refer to FIG. 2B which is a schematic diagram illustrating another preferred embodiment of a heat-dissipating fan module of a power supply according to the present invention. The structure and function of the elements of the heat-dissipating fan module in FIG. 2B are similar to those of the heat-dissipating fan module in FIG. 2A except that the reticular portion is separated from the casing 21 to form a reticular plate 26. As shown in FIG. 2B, the reticular plate 26 is fixed to one side of the casing 21 by screwing and covered the opening 23. In addition, the reticular plate 26 also can be fixed to the casing 21 by engaging or adhering.

Figure 3A:
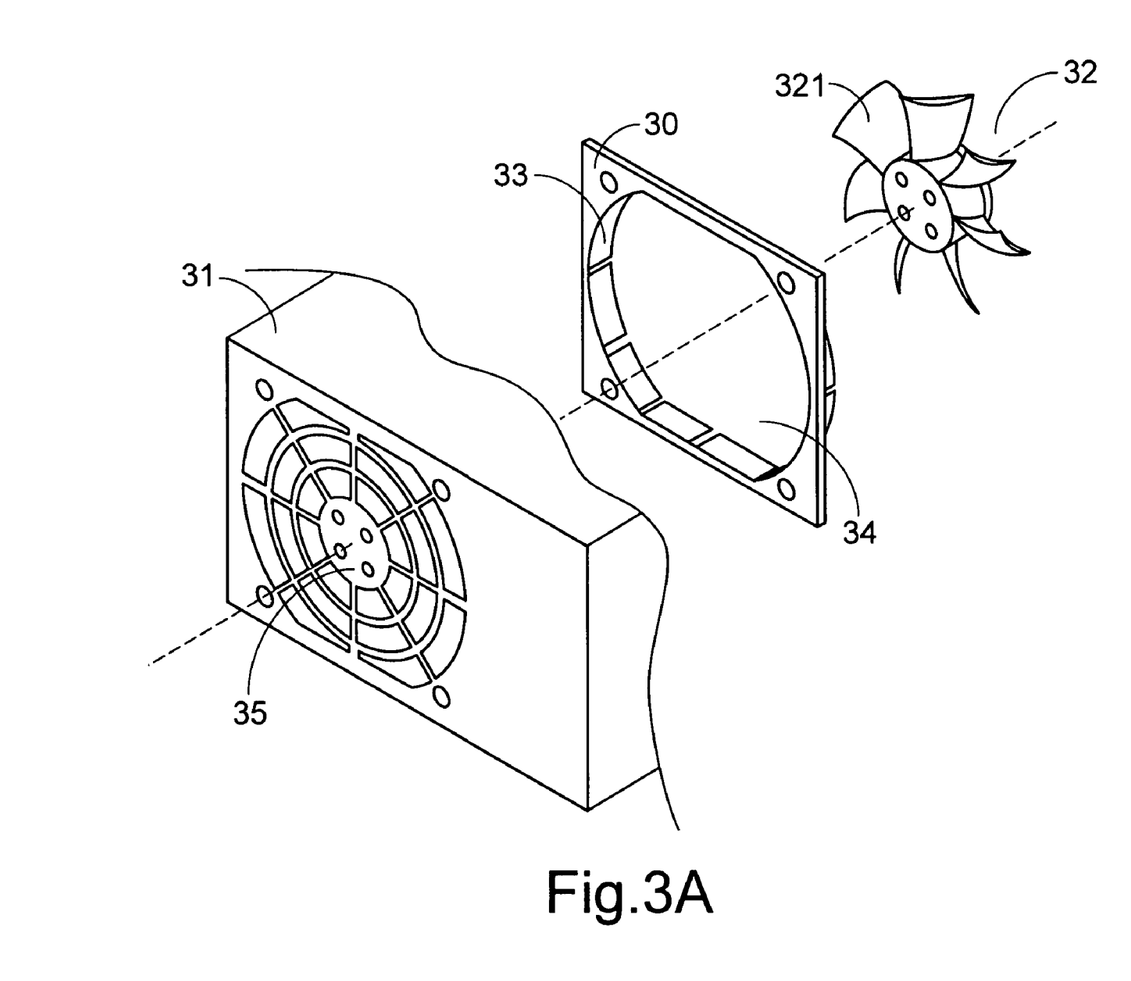
FIG. 3A is a schematic diagram illustrating a further preferred embodiment of a heat-dissipating fan module of a power supply according to the present invention, wherein a guiding device is disposed along an opening of a frame and the frame is separably fixed to a casing.

Please refer to FIG. 3A which is a schematic diagram illustrating a further preferred embodiment of a heat-dissipating fan module of a power supply according to the present invention. The heat-dissipating fan module includes a casing 31, a heat-dissipating fan 32 and a frame 30 having a guiding device 33. As shown in FIG. 3A, the casing 31 has a reticular portion 35 and the heat-dissipating fan 32 is fixed on the central portion of the reticular portion 35. The reticular portion 35 is integrally formed with the casing 31. The frame 30 includes an opening 34 and the guiding device 33 is disposed along the edge of the opening 34. When the frame 30 is fixed to the casing 31, the opening 34 of the frame 30 is correspondingly disposed to the reticular portion 35 of the casing 31. The frame 30 is fixed to the casing 31 by screwing, engaging or adhering. The guiding device 33 can be made of metal material, paper material or plastic material. According to the requirement of heat-dissipating effect, the angle between the guiding device 33 and the frame 30 can be adjusted from 5 to 90 degrees. In addition, as shown in FIG. 3A, the heat-dissipating fan 32 is a fan without frame.

Figure 3B:
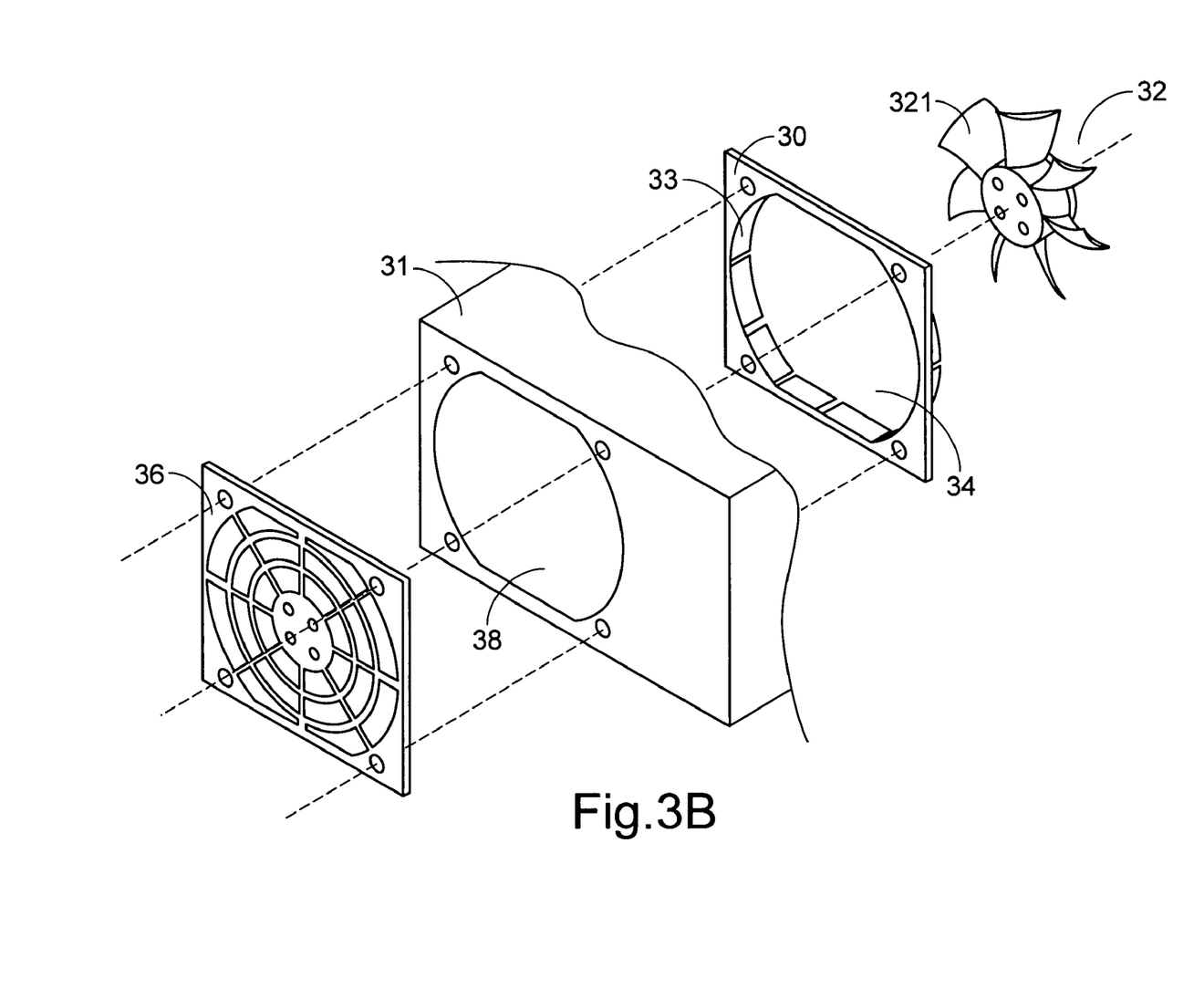
FIG. 3B is a schematic diagram illustrating a further preferred embodiment of a heat-dissipating fan module of a power supply according to the present invention, wherein a guiding device, a reticular plate and a casing are separable.

Please refer to FIG. 3B which is a schematic diagram illustrating a further preferred embodiment of a heat-dissipating fan module of a power supply according to the present invention. The structure and function of the elements of the heat-dissipating fan module in FIG. 3B are similar to those of the heat-dissipating fan module in FIG. 3A except that the reticular portion is separated from the casing 31 to form a reticular plate 36. As shown in FIG. 3B, the casing 31 includes an opening 38 and the reticular plate 36 is fixed to one side of the casing 31 by screwing and covered the opening 38. In addition, the reticular plate 36 also can be fixed to the casing 31 by engaging or adhering.

Figure 3C:
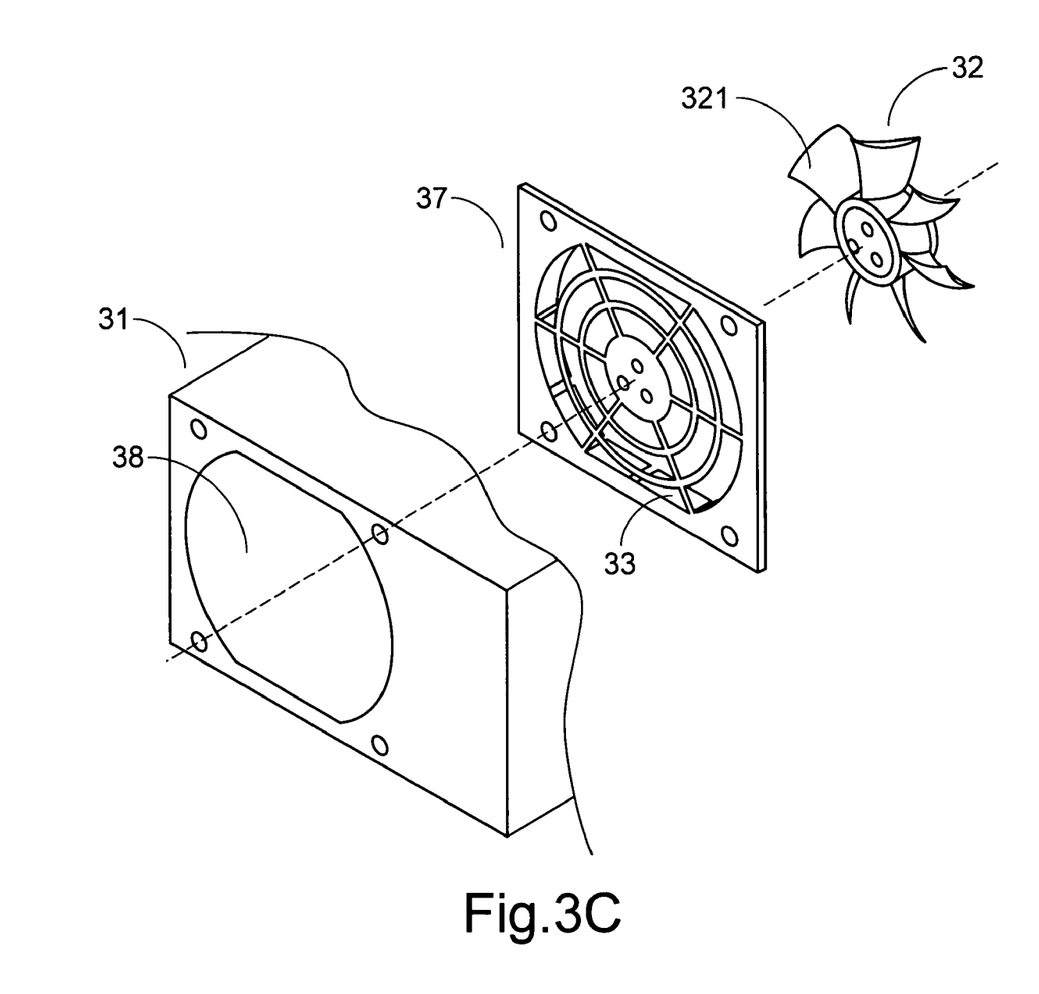
FIG. 3C is a schematic diagram illustrating a further preferred embodiment of a heat-dissipating fan module of a power supply according to the present invention, wherein a guiding device is integrally formed with a reticular plate but separated from a casing.

Please refer to FIG. 3C which is a schematic diagram illustrating a further preferred embodiment of a heat-dissipating fan module of a power supply according to the present invention. The heat-dissipating fan module includes a casing 31, a reticular plate 37, a guiding device 33 and a heat-dissipating fan 32. The casing 31 has an opening 38 on one side thereof. As shown in FIG. 3C, the reticular plate 37 is integrally formed with the guiding device 33. That is, the guiding device 33 is disposed along the outer edge of the reticular portion. The heat-dissipating fan 32 is fixed to the reticular plate 37 and the reticular plate 37 is fixed to the casing 31 and covers the opening 38. The reticular plate 37 and the heat-dissipating fan 32 can be fixed by screwing, engaging or adhering. In addition, the shape of the guiding device 33 can be a hollow half-cone or hollow column (not shown) so as to smoothly increase airflow between the interior and the exterior of the casing.

Figure 4:
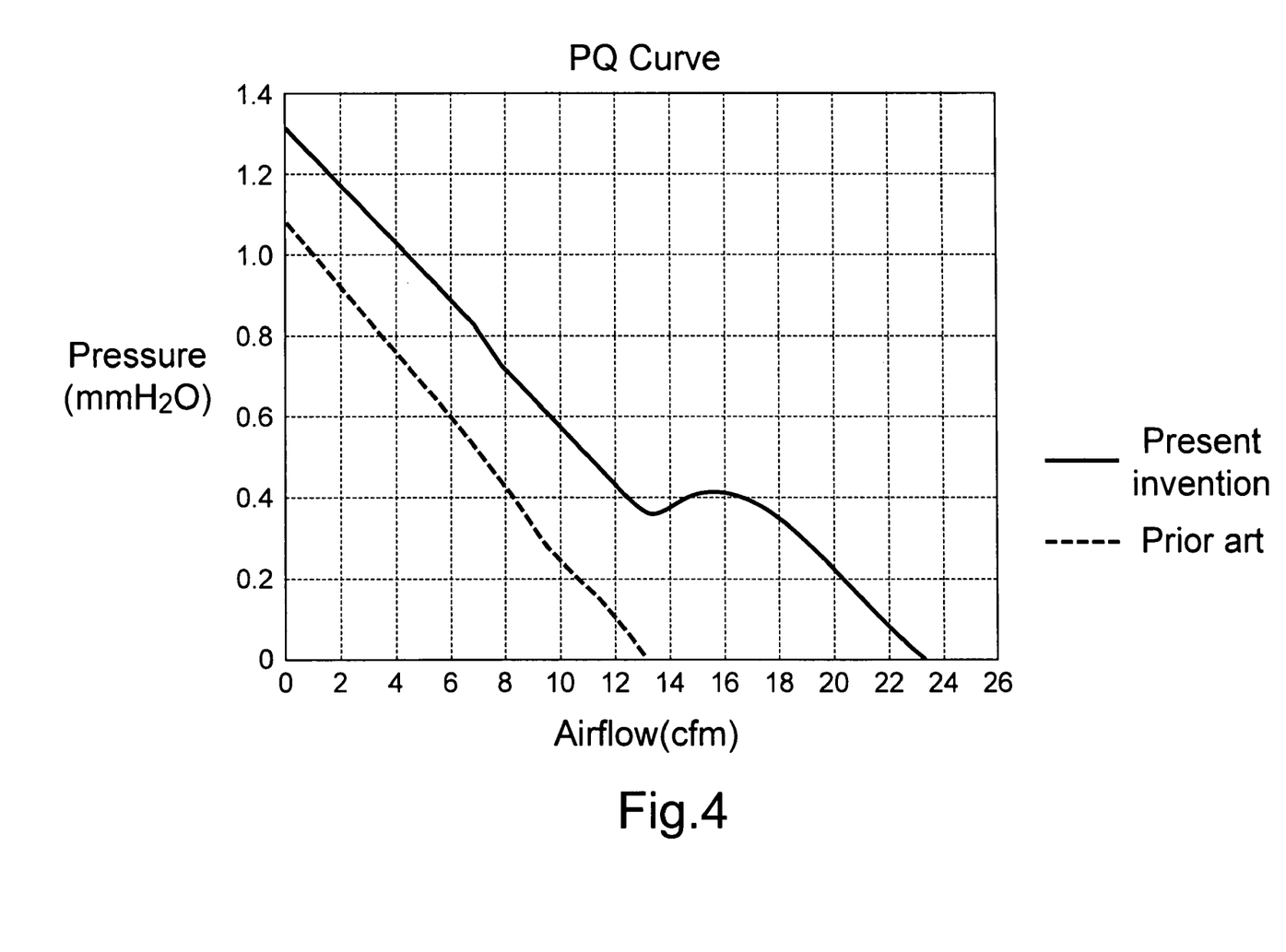
FIG. 4 is a plot illustrating the comparison of the characteristic curves of the static pressure—the airflow (PQ) of the heat-dissipating fan between the present invention of FIG. 2A and the prior art of FIG. 1B.

FIG. 4 is a plot illustrating the comparison of the characteristic curves of the static pressure—the airflow (PQ) of the heat-dissipating fan between the present invention of FIG. 2A and the prior art of FIG. 1B. As shown in FIG. 4, the dash line represents the PQ characteristic curve of the conventional heat-dissipating fan while the solid line represents that of the heat-dissipating fan of the present invention. The heat-dissipating effect of the heat-dissipating fan is dependent on airflow (cfm), static pressure (mm-$H_2O$) and the electrical bearing. In the same static pressure and the electrical bearing, the larger the airflow is, the larger the heat absorption of cold air is. That is, the more heat is transferred out by air flowing, so the heat-dissipating effect is more significantly. FIG. 4 shows that the airflow of the heat-dissipating fan of the present invention is 23 cfm comparing with that of the conventional heat-dissipating fan is 13 CFM. Hence, the maximum airflow performance of the heat-dissipating fan of the present invention increases 77% comparing to that of the conventional one.

To sum up, the present invention provides a heat-dissipating fan module of an electronic apparatus for saving the material, reducing the cost and enhancing the heat-dissipating effect. In addition, the heat-dissipating fan module including the fan without frame also can reduce the noise when operating.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A heat-dissipating fan module of an electronic apparatus, comprising:
   a casing having an opening, said opening having an airflow guiding device formed integrally therewith and along an edge thereof, wherein material that is removed to form said opening forms the guiding device by bending the material; and
   a heat-dissipating fan fixed into one side of said casing and correspondingly disposed on said opening.

2. The heat-dissipating fan module according to claim 1 wherein said guiding device is a metal material disposed on said edge portion of said opening, extended from said edge of said opening, and inclined toward the axis of the opening.

3. The heat-dissipating fan module according to claim 1 wherein said casing and said guiding device are disposed to form a particular angle.

4. The heat-dissipating fan module according to claim 3 wherein said particular angle is substantially 5 to 90 degrees.

5. The heat-dissipating fan module according to claim 1 wherein said heat-dissipating fan is a fan without a frame.

6. The heat-dissipating fan module according to claim 1 wherein said casing further comprises a reticular portion integrally formed therewith and disposed at the corresponding position of said opening.

7. The heat-dissipating fan module according to claim 1 further comprising a reticular plate, wherein said reticular plate is separably fixed to one side of said casing for covering said opening.

8. The heat-dissipating fan module according to claim 1 wherein said electronic apparatus is a power supply.

* * * * *